US008013475B2

(12) United States Patent
Wotruba et al.

(10) Patent No.: US 8,013,475 B2
(45) Date of Patent: Sep. 6, 2011

(54) REVERSE VOLTAGE PROTECTED INTEGRATED CIRCUIT ARRANGEMENT FOR MULTIPLE SUPPLY LINES

(75) Inventors: Bernhard Wotruba, Padua (IT);
Andrea Logiudice, Padua (IT); Andrea Scenini, Abano Terme (IT); Salvatore Pastorina, Catania (IT)

(73) Assignee: Infineon Technologies AG, Villach (AT)

( * ) Notice: Subject to any disclaimer, the term of this patent is extended or adjusted under 35 U.S.C. 154(b) by 893 days.

(21) Appl. No.: 11/965,501

(22) Filed: Dec. 27, 2007

(65) Prior Publication Data

US 2008/0225454 A1 Sep. 18, 2008

Related U.S. Application Data

(63) Continuation-in-part of application No. 11/724,606, filed on Mar. 15, 2007, now abandoned.

(51) Int. Cl.
*H01H 83/00* (2006.01)
(52) U.S. Cl. ............................. 307/130; 361/82; 361/84
(58) Field of Classification Search .................. 307/130; 361/82, 84; 257/373
See application file for complete search history.

(56) References Cited

U.S. PATENT DOCUMENTS

| 6,107,844 A * | 8/2000 | Berg et al. ..................... 327/110 |
| 2004/0066217 A1 | 4/2004 | Daniels et al. |
| 2004/0217653 A1 | 11/2004 | Neidorff |

FOREIGN PATENT DOCUMENTS

| EP | 0 222 472 A2 | 5/1987 |
| EP | 0 703 620 A1 | 3/1996 |
| EP | 0 847 089 A1 | 6/1998 |

OTHER PUBLICATIONS

"Substrate Connection by Analog Switching to Most Negative Power Supply," IBM Technical Disclosure Bulletin, Apr. 1982, 2 pages, vol. 24, No. 11B.

* cited by examiner

*Primary Examiner* — Rexford N Barnie
*Assistant Examiner* — Hal I Kaplan
(74) *Attorney, Agent, or Firm* — Slater & Matsil, L.L.P.

(57) ABSTRACT

An integrated circuit arrangement includes a semiconductor body having a substrate and at least one substrate terminal. At least one semiconductor component is integrated in the semiconductor body and is connected between a first supply terminal and a second supply terminal. The first supply potential is higher than the second supply potential during normal operation of the semiconductor component and the first supply potential is lower than the second supply potential during reverse voltage operation of the semiconductor component. A switch is adapted to couple at least one of the substrate terminals to the first supply terminal during reverse voltage operation and to the second supply terminal during normal operation.

16 Claims, 6 Drawing Sheets

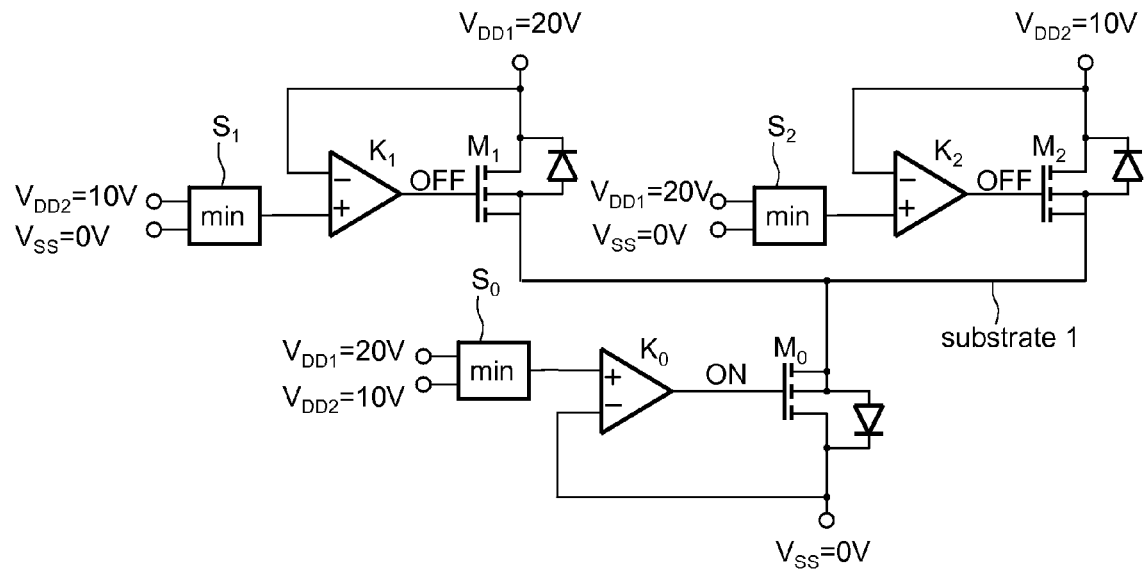
FIG. 7A    normal operation
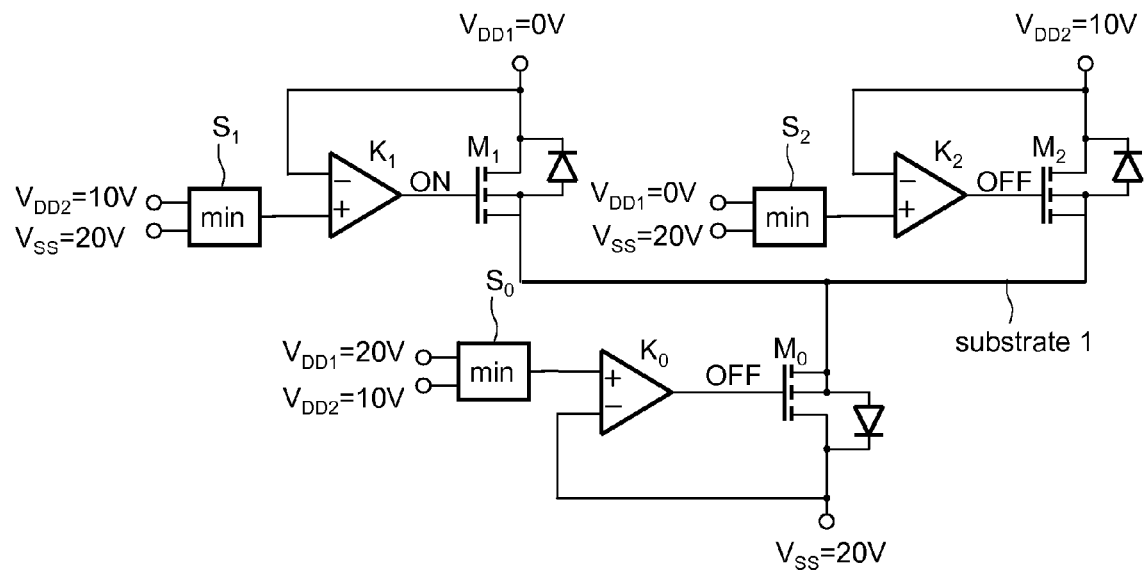
FIG. 7B    reverse voltage operation

REVERSE VOLTAGE PROTECTED INTEGRATED CIRCUIT ARRANGEMENT FOR MULTIPLE SUPPLY LINES

This is a continuation-in-part application of U.S. patent application Ser. No. 11/724,606, filed on Mar. 15, 2007 now abandoned, entitled "Reverse Voltage Protected Integrated Circuit Arrangement," which application is incorporated herein by reference.

TECHNICAL FIELD

The present invention relates to an integrated circuit arrangement for protecting a semiconductor device during reverse voltage operation.

BACKGROUND

In many applications, semiconductor devices have to be equipped with a reverse voltage protection. In unprotected devices, the supply voltage can be shorted by the substrate diode of the semiconductor chip. Considering a MOSFET as an example, a substrate diode can be formed by the pn-junction between a p-doped substrate and an n-doped drain zone located adjacent to the substrate in an epitaxial layer which has been deposited onto the substrate. In order to inhibit such short circuits, the substrate can be isolated during reverse voltage operation. As a consequence, the potential of the substrate is floating and undefined, i.e., the potential of the substrate depends on the state of other components integrated in the same substrate. A floating substrate entails the risk of a latch-up of parasitic thyristor structures inherent in many integrated circuits.

There is a general need for an integrated circuit arrangement which is capable of withstanding a certain reverse voltage without the risk of a high current flow and a latch-up due to parasitic semiconductor structures.

SUMMARY OF THE INVENTION

One example of the invention relates to an integrated circuit arrangement with a reverse voltage protection, the circuit arrangement comprising: a semiconductor body having a substrate and at least one substrate terminal; at least one semiconductor component integrated in the semiconductor body and being connected between a first supply terminal providing a first supply potential and a second supply terminal providing a second supply potential, the first supply potential being higher than the second supply potential during normal operation of the semiconductor component and the first supply potential being lower than the second supply potential during reverse voltage operation of the semiconductor component; and switching means adapted for connecting at least one of the substrate terminals to the first supply terminal during reverse voltage operation and to the second supply terminal during normal operation.

Another example of the invention relates to an integrated circuit arrangement with a reverse voltage protection, the circuit arrangement comprising: a semiconductor body having a substrate and at least one substrate terminal; at least a first semiconductor component integrated in the semiconductor body and being connected between a first supply terminal providing a first supply potential and a third supply terminal providing a third supply potential; at least a second semiconductor component integrated in the semiconductor body and being connected between a second supply terminal providing a second supply potential and the third supply terminal, where the first supply potential and the second supply potential are higher than the third supply potential during normal operation of the integrated circuit arrangement and the first supply potential and/or the second supply potential are lower than the third supply potential during reverse voltage operation of the integrated circuit arrangement; and switching means configured to connect at least one of the substrate terminals to the third supply terminal during normal operation and to connect at least one of the substrate terminals either to the first or the second supply terminal, whichever has the lower potential.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 7A illustrates the switching states of the substrate switches of FIG. 6 during normal operation;

FIG. 7B illustrates the switching states of the substrate switches of FIG. 6 during reverse voltage operation.

DETAILED DESCRIPTION OF ILLUSTRATIVE EMBODIMENTS

Figure 1A:
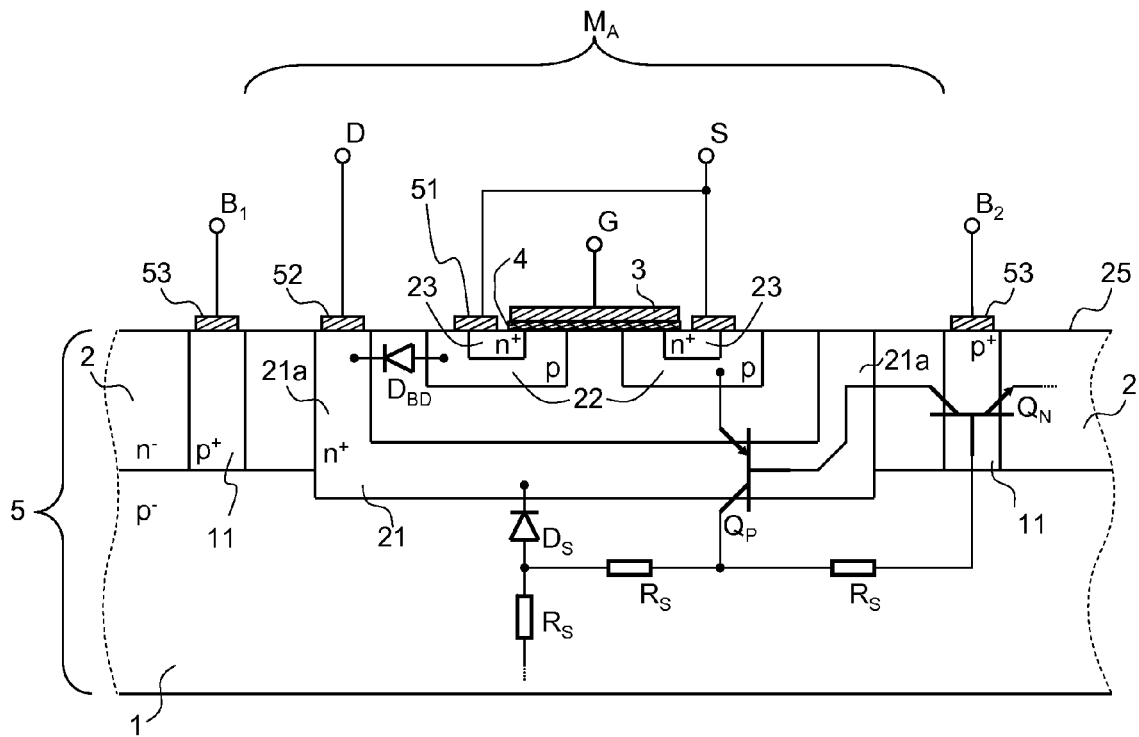
FIG. 1A shows a MOS-transistor as an exemplary semiconductor component integrated in a semiconductor body, wherein parasitic thyristor structures are illustrated by means of circuit diagram symbols.

FIG. 1A shows—as an exemplary semiconductor component—a MOS-transistor that is integrated in a semiconductor body. Parasitic diode and thyristor structures, which are formed between active areas of the semiconductor component and between active areas and a semiconductor substrate, are illustrated by means of circuit diagram symbols. The example shows an n-channel D-MOS transistor (double diffused vertical MOS transistor) disposed above a p-doped substrate. Of course the invention is also applicable to p-channel MOSFETs in n-doped substrate material and to pure bipolar technologies. Dependent on the manufacturing technology, n-doped wafers can be used, too.

The example depicted in FIG. 1A comprises a semiconductor body 5 comprised of a weakly p-doped substrate 1 with a weakly n-doped epitaxial layer 2 deposited thereon. A surface 25 of the epitaxial layer 2 forms a surface of the semiconductor body 5 which is formed by the substrate 1 and the epitaxial layer 2. A semiconductor component $M_A$ is integrated into the semiconductor body 5. In the present example, the semiconductor body 5 is an n-channel MOS transistor. Close to the boundary between the substrate 1 and the epitaxial layer 2, a heavily n-doped, buried drain zone 21 is located extending along the boundary in a lateral direction. The boundary may be overlapped by the drain zone 21, i.e., the buried drain zone 21 is partly located in the substrate 1 and partly located in the epitaxial layer 2. At least one drain contact zone 21a extends from the surface 25 of the semiconductor body 5 in a vertical direction to the drain zone 21 in order to allow a low-resistance external contacting of the drain zone 21. In the depicted example, one drain contact zone 21a is located on each side of the drain zone 21. At least one body zone 22 extends from the surface 25 of the semiconductor body 5 into the epitaxial layer 2. In case of an n-channel MOSFET, the body zone 22 is p-doped. In the depicted example, a second body zone 22 is located (in a lateral direction) adjacent to the aforementioned body zone 22. Surrounded by the body zones 22, an n-doped source zone 23 extends from the surface 25 of the semiconductor body 5 into each body zone 22. A gate electrode 3 extends parallel to the surface 25 overlapping the body zone 22 and is coupled to gate terminal G. The gate electrode 3 is isolated from the rest of the semiconductor body 5 by an oxide layer 4. A metallization 51 covers at least partly the source zone 23 and the body zone 22, thus shortening source zone 23 and body zone 22 and providing an electrical contact to a source terminal S. A metallization 52 is disposed above the drain contact zone 21a, thus providing an electric contact to a drain terminal D. A substrate contact zone 11 extends in a vertical direction from the surface 25 of the semiconductor body 5 to the substrate 1. The substrate contact zone 11 encloses the semiconductor component $M_A$ and isolates the semiconductor component $M_A$ from other semiconductor components integrated in the same substrate 1. Pads of metallization 53 are used to provide an electric contact to substrate terminals $B_1$, $B_2$, etc. for contacting the substrate 1 at different locations.

A pn-junction between the body zone 22 and the drain zone 21 (or the drain contact zone 21a) forms a so called body diode $D_{BD}$. The pn-junction between the drain zone 21 and the substrate 1 forms a substrate diode $D_S$. The body diode $D_{BD}$ and the substrate diode $D_S$ together can also be represented by a pnp-transistor $Q_P$, wherein the body diode $D_{BD}$ represents the emitter-base diode and the substrate diode $D_S$ represents the collector-base diode of the pnp bipolar transistor $Q_P$. That is, the p-doped body zone 22, the n-doped drain zone 21 and the p-doped substrate 1 form a (vertical) pnp-transistor $Q_P$. The n-doped drain zone 21, the p-doped substrate contact zone 11 and the epitaxial layer 2 "outside" the substrate contact zone 11 form a (lateral) npn-transistor $Q_N$. The substrate 1 is connected to the collector of the pnp-transistor $Q_P$ and to the base of the npn-transistor $Q_N$. Resistors $R_S$ indicate the non ideal conductivity of the substrate 1.

The electrical equivalent circuit of the semiconductor component described above is depicted in FIG. 1B and will be explained in more detail in the following description. Semiconductor component $M_A$ is shown in the left part of the circuit diagram. The body diode $D_{BD}$ connects the body portion 23 and the drain terminal D of the semiconductor component $M_A$. The short circuits between the source terminal S and the body portion 23 (by means of metallization 51, see FIG. 1A) are also shown in the circuit diagram. The drain of the semiconductor component $M_A$ is connected to the base of the pnp-transistor $Q_P$ and to the collector of the npn-transistor $Q_N$. The body portion 23 is connected to the emitter of the pnp-transistor $Q_P$. The base of the npn-transistor $Q_N$ is connected to the collector of the pnp-transistor $Q_P$ via the substrate 1 (indicated by means of the resistors $R_S$ which symbolize the resistivity of the substrate 1). The emitter of the npn-transistor $Q_N$ can be connected to the drain of another semiconductor component $M_B$ which can be integrated in the same semiconductor body 5 (see FIG. 1A) adjacent to the semiconductor component $M_A$. The substrate diode $D_S$ connects the drain terminal D of semiconductor component $M_A$ and the substrate 1. The pnp-transistor $Q_P$ and the npn-transistor $Q_N$ together form a parasitic thyristor $T_{PAR}$, wherein the gate of the thyristor is formed by the substrate 1. The effect of this parasitic thyristor $T_{PAR}$ is explained in more detail below with reference to FIG. 3.

Figure 1B:
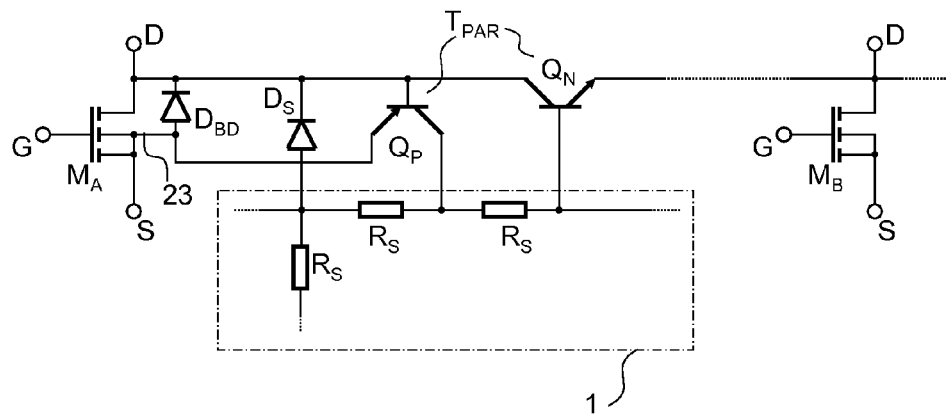
FIG. 1B shows an equivalent circuit diagram for the circuit arrangement shown in FIG. 1A.
Figure 2:
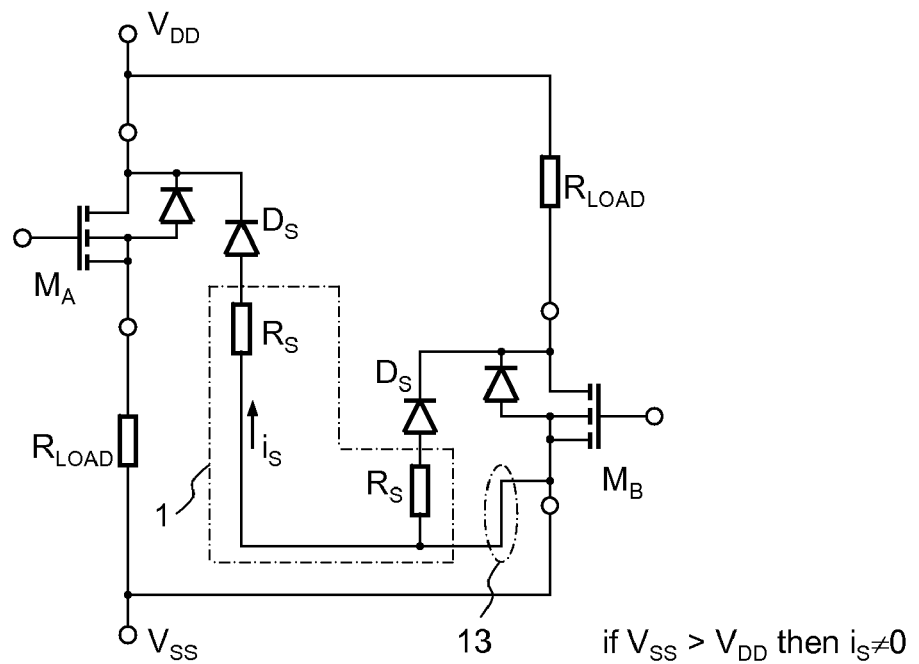
FIG. 2 shows an equivalent circuit diagram of an integrated circuit arrangement comprising a high-side switch and a low-side switch.

FIG. 2 shows a circuit arrangement comprising a first MOS-transistor $M_A$ serving as a high side semiconductor switch and a second MOS-transistor $M_B$ serving as a low side semiconductor switch. A drain terminal of the high side switch $M_A$ is connected to a first supply terminal providing a first supply potential $V_{DD}$ and the source terminal of the high side switch $M_A$ is connected to a second supply terminal (providing a second supply potential $V_{SS}$) via a resistive load $R_{LOAD}$. The low side switch $M_B$ has its source terminal directly connected to the second supply terminal ($V_{SS}$) and its drain terminal connected to the first supply terminal ($V_{DD}$) via a load $R_{LOAD}$. For the further discussion it is assumed that the high side switch $M_A$ and the low side switch $M_B$ both are integrated in the same substrate 1. Consequently both transistors $M_A$ and $M_B$ are coupled by the parasitic structures depicted in FIGS. 1A and 1B. In the case shown in FIG. 2, only the substrate diodes $D_S$ are relevant. The drain terminals of the high side and the low side switches $M_A$, $M_B$ are connected via their substrate diodes $D_S$ and the substrate resistors $R_S$.

During normal operation, the first supply potential $V_{DD}$ is higher than the second supply potential $V_{SS}$ and the substrate 1 is connected to the second supply potential $V_{SS}$ in order to inhibit the latch-up of the parasitic thyristor $T_{PAR}$ formed by the bipolar transistors $Q_N$ an $Q_P$ (see FIG. 1B). Considering the case of a reverse voltage, i.e., the second supply potential $V_{SS}$ being higher than the first supply potential $V_{DD}$, one can easily see that the voltage source providing the supply potentials $V_{DD}$ and $V_{SS}$ is shorted by the substrate diode $D_S$ of the high side switch $M_A$ by providing a low-resistance current path from the second supply potential $V_{SS}$ to the first supply potential $V_{DD}$. As a consequence, a high current is flowing through the substrate diode $D_S$ of the high side switch $M_A$ can destroy the high side switch $M_A$ and adjacent semiconductor components (not shown).

Figure 3:
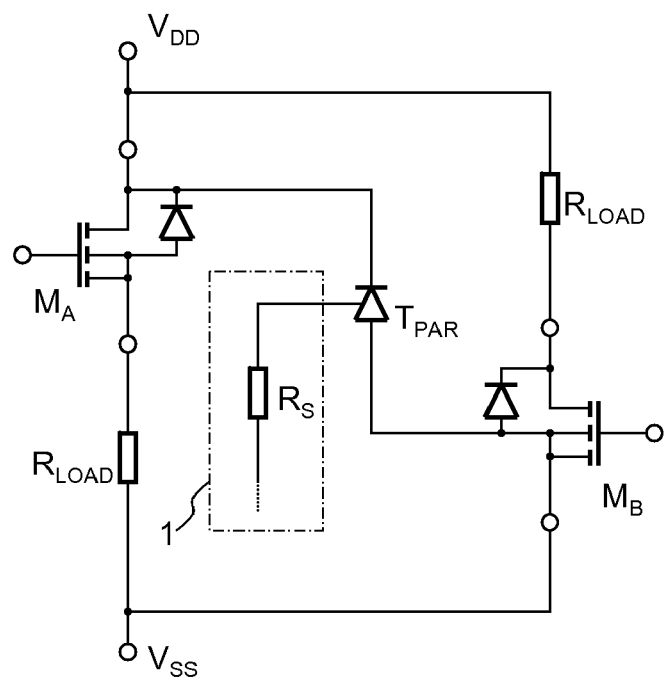
FIG. 3 shows the integrated circuit arrangement of FIG. 2 including a parasitic thyristor structure.

In order to prevent high substrate current in case of a reverse voltage, the substrate 1 may be isolated from the second supply potential $V_{SS}$. As a consequence, the potential of the substrate 1 is floating and determined by the state of adjacent semiconductor components integrated in the same semiconductor body. Having a floating substrate 1, the parasitic thyristor $T_{PAR}$ connecting the drain of the high side switch $M_A$ and the body of the low side switch $M_B$ cannot be neglected as already mentioned above. FIG. 3 shows the high side switch $M_A$ and the low side switch $M_B$ of FIG. 2 additionally including the parasitic thyristor $T_{PAR}$, but neglecting the substrate diodes for the sake of simplicity. The gate of the parasitic thyristor $T_{PAR}$ is connected to the substrate 1. It is obvious that a floating substrate 1 can easily activate the parasitic thyristor $T_{PAR}$, thus again shortening the voltage source providing the supply potentials $V_{DD}$ and $V_{SS}$.

There is a need for an "intelligent" circuit for, on the one hand, preventing a latch up of the parasitic thyristor $T_{PAR}$ and, on the other hand, preventing a short circuit via the substrate diodes $D_S$ in reverse voltage operation as well as in normal operation.

Figure 4:
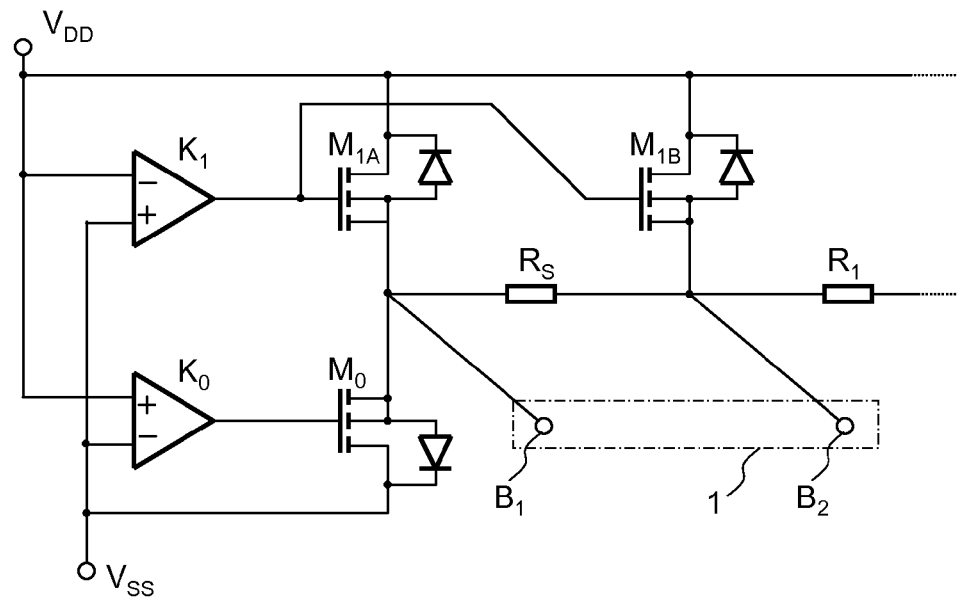
FIG. 4 shows a first example of the invention comprising a circuit arrangement adapted for connecting at least one substrate terminal either to a first or to a second supply terminal dependent on which supply terminal provides the lower supply potential.

FIG. 4 illustrates one example of the inventive integrated circuit arrangement adapted for connecting the substrate terminals $B_1$, $B_2$, etc. with either the first or the second supply terminal dependent on which supply potential is the lowest. That is, the substrate terminals $B_1$, $B_2$ always receive the lowest supply potential, which is the second supply potential $V_{SS}$ in normal operation and the first supply potential $V_{DD}$ in reverse voltage operation.

Switching of the substrate potential is effected by means of a transistor half-bridge comprising a first semiconductor switch $M_{1A}$ and a second semiconductor switch $M_0$, wherein the first semiconductor switch $M_{1A}$ is connected between a first substrate terminal $B_1$ and the first supply terminal ($V_{DD}$), and wherein the second semiconductor switch $M_0$ is connected between the first substrate terminal $B_1$ and the second supply terminal ($V_{SS}$). That is, the common node of the semiconductor switches $M_{1A}$ and $M_0$ is connected to one substrate terminal (e.g., substrate terminal $B_1$) and the switching state of the half-bridge determines the potential of the substrate 1. A first and a second comparator $K_1$, $K_0$ control the switching states of the first and the second semiconductor switches $M_{1A}$, $M_0$ of the half-bridge such that the first semiconductor switch $M_{1A}$ is in an on-state and the second semiconductor switch $M_0$ is in an off-state if the first supply potential $V_{DD}$ is lower than the second supply potential $V_{SS}$ (i.e., reverse voltage operation), and vice versa. An output terminal of the first comparator $K_1$ is therefore connected to a control terminal of the first semiconductor switch $M_{1A}$, and an output of the second comparator $K_0$ is connected to a control terminal of the second semiconductor switch $M_0$. Both comparators $K_1$, $K_0$ have an inverting and a non-inverting input, wherein the inverting input of the first comparator $K_1$ and the non-inverting input of the second comparator $K_0$ are connected to the first supply terminal ($V_{DD}$), and the non-inverting input of the first comparator $K_1$ and the inverting input of the second comparator $K_0$ are connected to the second supply terminal $V_{SS}$.

Optionally a further semiconductor switch $M_{1B}$ is connected between the first supply terminal ($V_{DD}$) and a second substrate terminal $B_2$, wherein a control terminal of the further semiconductor switch $M_{1B}$ is connected to the control terminal of the first semiconductor switch $M_{1A}$. This further semiconductor switch $M_{1B}$ allows contact with different substrate terminals ($B_1$, $B_2$, etc.) in order to provide a uniform electric substrate potential ($V_{DD}$) to the substrate 1 in case of a reverse voltage operation. During normal operation it can be useful to connect only one substrate terminal $B_1$ to the second supply potential $V_{SS}$ and to connect further substrate terminals ($B_2$, etc.) to the second supply potential $V_{SS}$ via a parallel resistor $R_1$ (parallel to the substrate resistor $R_S$). This is especially expedient if a "hard" connection to second supply terminal $V_{SS}$ is unwanted in order to allow special guard rings to operate, thus properly inhibiting adverse effects of a reverse current.

If, during normal operation, a reverse current flows from the source to the drain terminal of transistor $M_B$, for example, then npn-transistor $Q_N$ can be activated and will inject minority carriers into the substrate leading to possible malfunction of other parts of the circuit integrated in the same substrate. Several techniques may be applied to reduce the activation of npn-transistor $Q_N$. Most of them are based on guard ring arrangements that are shorting, by means of a switch, the base-emitter junction of npn-transistor $Q_N$ during reverse current operation. To be effective, the substrate resistance close to the npn-transistor $Q_N$ has to be high, allowing the substrate potential to be pulled to the lowest possible potential, which is the voltage drop $V_{SS}$–$V_{BD}$ across body diode $D_{BD}$ during reverse current operation. Therefore some substrate terminals (e.g., $B_2$) are not directly switched to the second supply potential $V_{SS}$ but via a resistor $R_1$. That is, the function of resistor $R_1$ is to decouple two or more substrate locations on the same chip. While substrate terminal $B_1$ is connected via the low-resistance semiconductor switch $M_0$ to $V_{SS}$, the second substrate terminal $B_2$ is connected via a higher resistance, given by the parallel connection of $R_1$ with the substrate resistance.

Figure 5:
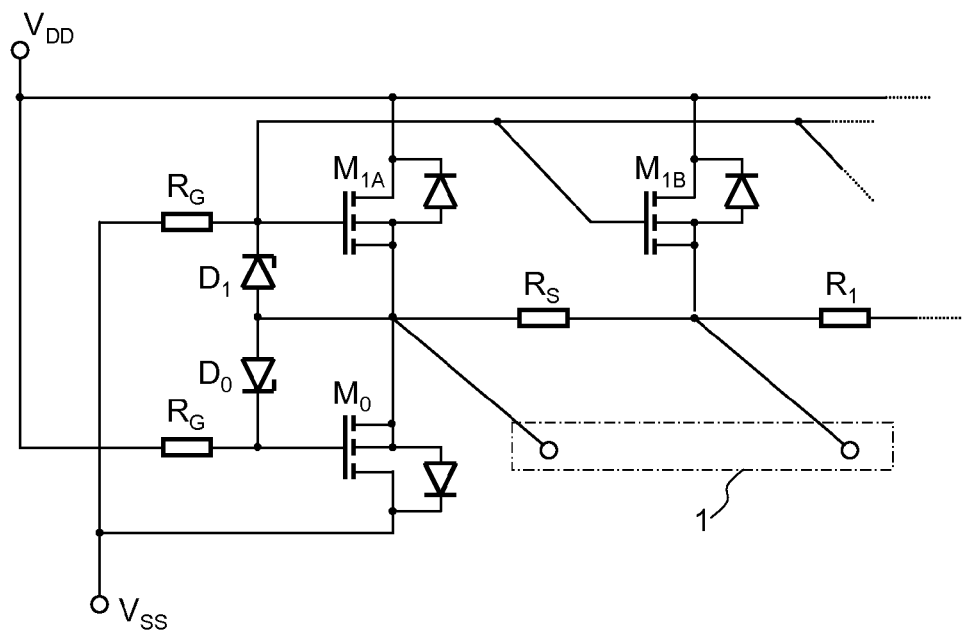
FIG. 5 shows another example similar to the example of FIG. 4, wherein the comparison of the supply potentials is provided by a first and a second transistor.

One simple example of the invention is depicted in FIG. 5. The semiconductor switches ($M_{1A}$, $M_{1B}$, etc., and $M_0$) are usually implemented as MOS-transistors having a drain terminal, a source terminal, and a gate terminal (control terminal). The drain terminal of the first semiconductor switch $M_{1A}$ is connected to the first supply terminal ($V_{DD}$), the drain terminal of the second semiconductor switch $M_0$ is connected to the second supply terminal ($V_{SS}$). The gate terminal of the first semiconductor switch $M_{1A}$ is connected to the second supply terminal ($V_{SS}$) via a first gate resistor $R_G$, the gate terminal of the second semiconductor switch $M_0$ is connected to the first supply terminal via a second gate resistor $R_G$. The source terminals of the first and the second semiconductor switches $M_{1A}$, $M_0$ both are connected to a first substrate terminal $B_1$. Optionally at least one further semiconductor switch $M_{1B}$ is connected between the first supply terminal ($V_{DD}$) and a second substrate terminal $B_2$. The drain terminal of each further semiconductor switch $M_{1B}$ is connected to the drain terminal of the first semiconductor switch $M_{1A}$ (and therefore to the first supply terminal $V_{DD}$), the gate terminal of each further semiconductor switch $M_{1B}$ is connected to the gate terminal of the first semiconductor switch $M_{1A}$, and each source terminal of the further semiconductor switch $M_{1B}$ is connected to a different substrate terminal ($B_2$, etc.) for the reasons explained above. Diodes $D_0$ and $D_1$ are also illustrated.

Figure 6:
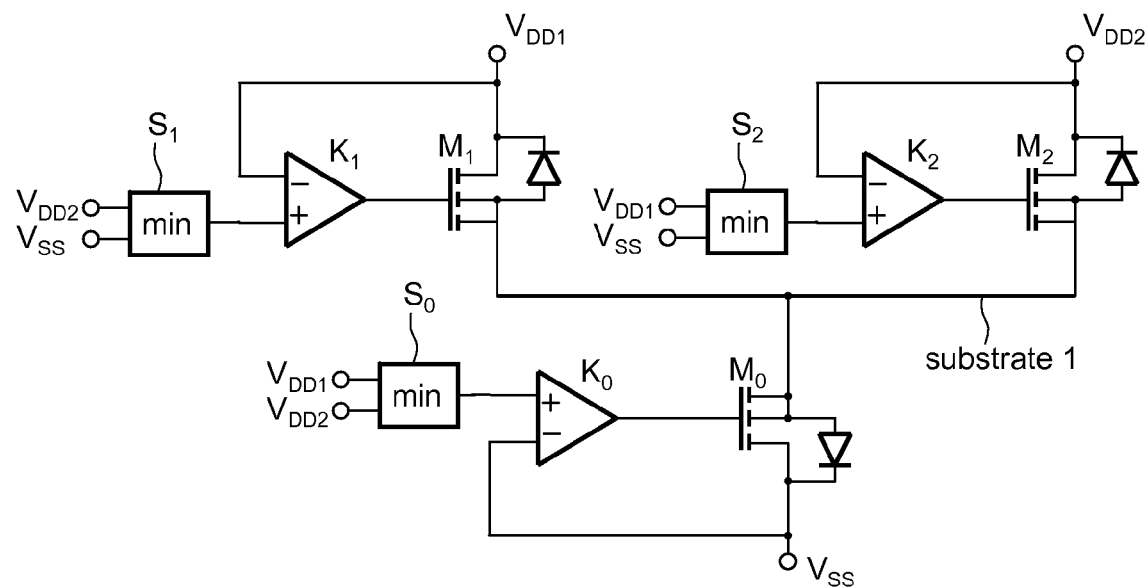
FIG. 6 shows a further example of the invention applicable on circuit arrangements with multiple supply lines.

FIG. 6 illustrates another example of the inventive integrated circuit arrangement, where, in contrast to the example of FIG. 4, the present integrated circuit arrangement comprises multiple supply lines, that is the integrated circuit arrangement comprises at least one semiconductor component (see MOSFET $M_A$ in FIG. 8) supplied by a first supply potential $V_{DD1}$ and at least one semiconductor component (see MOSFET $M_B$ in FIG. 8) supplied by a second supply potential $V_{DD2}$. A first semiconductor switch $M_1$ is connected between the substrate 1 and a first supply terminal receiving the first supply potential $V_{DD1}$, a second semiconductor switch $M_2$ is connected between the substrate 1 and a second supply terminal receiving the second supply potential $V_{DD2}$, and a third semiconductor switch $M_0$ is connected between the substrate 1 and a third supply terminal receiving a third supply potential $V_{SS}$ which generally is a reference potential, e.g., ground potential. The semiconductor switches $M_0$, $M_1$, and $M_2$ may be implemented as MOSFETs, each having a gate and a drain-source path connecting the substrate 1 and the first, the second, or the third supply terminal, respectively. The gates of the MOSFETS $M_0$, $M_1$, and $M_2$ are controlled dependent on the result of a comparison of the first, the second and the third supply potentials $V_{DD1}$, $V_{DD2}$, $V_{SS}$. The switches $M_0$, $M_1$, and $M_2$ are controlled such that the switch that is connected to the lowest of the three supply potentials ($V_{DD1}$, $V_{DD2}$, $V_{SS}$) is on and the other two switches are off.

The integrated circuit arrangement is in a state of normal operation if the first and the second supply potential are higher than the third supply potential, that is $V_{DD1} > V_{DD2} > V_{SS}$; or $V_{DD2} > V_{DD1} > V_{SS}$.

In this case the third semiconductor switch $M_0$ is switched on, so that the substrate 1 is connected to the third supply potential $V_{SS}$. The integrated circuit arrangement is in a state of reverse voltage operation if at least one of the two supply potentials $V_{DD1}$ and $V_{DD2}$ is lower than the third supply potential $V_{SS}$, that is $V_{DD1} < V_{SS}$ and/or $V_{DD2} < V_{SS}$.

In this case the first or the second semiconductor switch $M_1$ or $M_2$ is switched on, dependent on which switch is connected to the lower supply potential. This functionality is—in the example of FIG. 6—provided by the minimum selectors $S_0$, $S_1$, $S_2$ and the comparators $K_0$, $K_1$, $K_2$.

The output of the comparator $K_1$ is connected to the gate of the first MOSFET $M_1$, the inverting input of the comparator $K_1$ receives the first supply potential $V_{DD1}$ and the non-inverting input is connected to the first minimum selector $S_1$ which supplies the second supply potential $V_{DD2}$ or the third supply potential $V_{SS}$ to the non-inverting input of the first comparator $K_1$ dependent on which supply potential is lower. That is, comparator $K_1$ switches on MOSFET $M_1$ if $\min\{V_{DD2}, V_{SS}\} > V_{DD1}$ (i.e., reverse voltage operation).

The output of the comparator $K_2$ is connected to the gate of the second MOSFET $M_2$, the inverting input of the comparator $K_2$ receives the second supply potential $V_{DD2}$ and the non-inverting input is connected to the second minimum selector $S_2$ which supplies the first supply potential $V_{DD1}$ or the third supply potential $V_{SS}$ to the non-inverting input of the comparator $K_2$ dependent on which supply potential is lower. That is, comparator $K_2$ switches on MOSFET $M_2$ if $\min\{V_{DD1}, V_{SS}\} > V_{DD2}$ (i.e., reverse voltage operation).

The output of the comparator $K_0$ is connected to the gate of the third MOSFET $M_0$, the inverting input of the comparator $K_0$ receives the third supply potential $V_{SS}$ and the non-inverting input is connected to the third minimum selector $S_0$ which supplies the first supply potential $V_{DD1}$ or the second supply potential $V_{DD2}$ to the non-inverting input of the comparator $K_0$ dependent on which supply potential is lower. That is, comparator $K_0$ switches on MOSFET $M_0$ if $\min\{V_{DD1}, V_{DD2}\} > V_{SS}$ (i.e., normal operation).

FIG. 7A and FIG. 7B illustrate an example of normal operation and of reverse voltage operation, respectively, of the circuit of FIG. 6. In the example of FIG. 7A, a first power supply of 20V and a second power supply of 10V, both relating to the third supply (i.e., ground) potential of 0V. In normal operation, $V_{DD1} = 20V$, $V_{DD2} = 10V$ and $V_{SS} = 0V$, and the third MOSFET $M_0$ is switched on by comparator $K_0$ to supply the lowest supply potential ($V_{SS} = 0V$) to the substrate 1.

FIG. 7B illustrates the case when the 20V power supply is reversely connected. In this example of reverse voltage operation, $V_{DD1} = 0V$, $V_{DD2} = 10V$ and $V_{SS} = 20V$, and the first MOSFET $M_1$ is switched on by comparator $K_1$ to supply the lowest supply potential ($V_{DD1} = 0V$) to the substrate 1.

Figure 8:
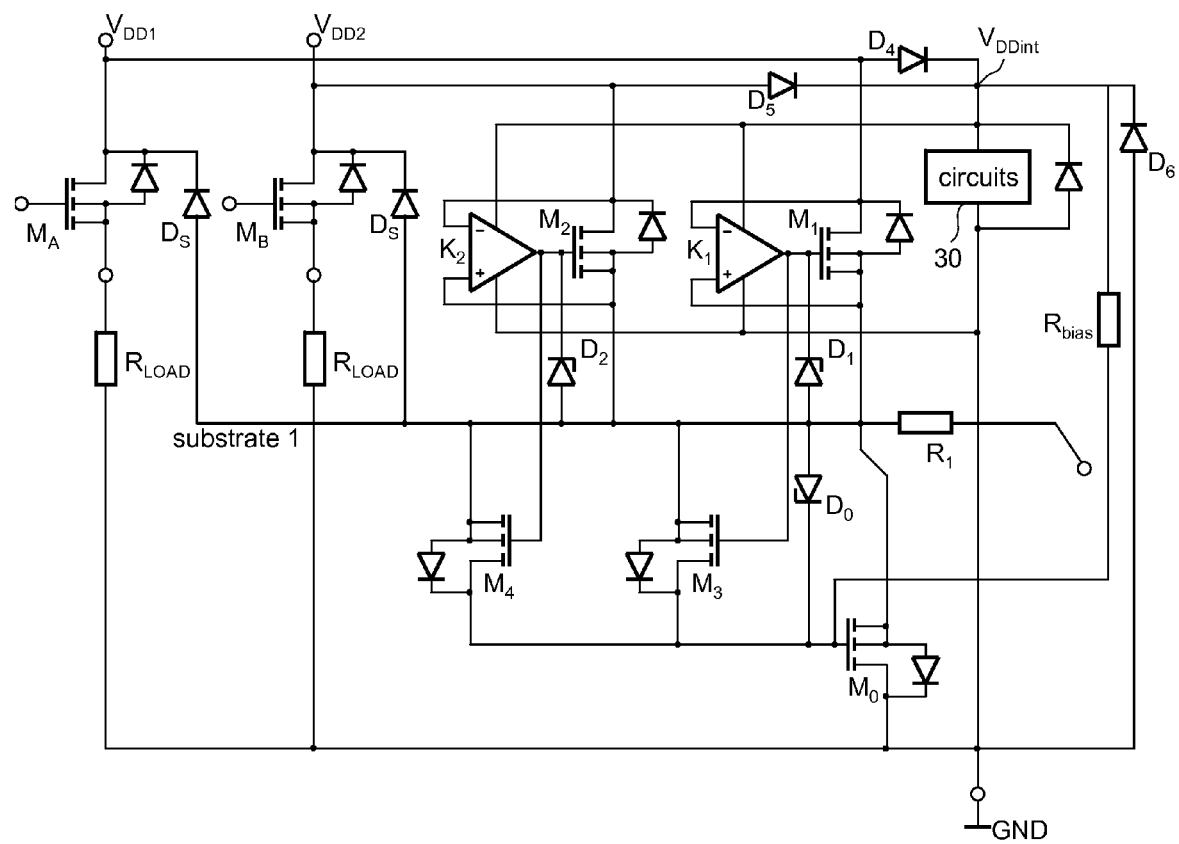
FIG. 8 illustrates the implementation of the circuit of FIG. 6 in more detail.

FIG. 8 illustrates a more detailed implementation of the exemplary circuit of FIG. 6. The circuit of FIG. 8 comprises two high side power switches $M_A$, $M_B$ connected to the first supply terminal ($V_{DD1}$) and the second supply terminal ($V_{DD2}$) respectively. A load $R_{LOAD}$ is connected between each power switch $M_A$, $M_B$ and the third supply terminal providing the third supply potential, which is here denoted as GND. Each of the power switches $M_A$, $M_B$ comprises a control terminal receiving a driver signal that determines the switching state (on/off) of the respective switch.

The reverse voltage protection is provided by the MOSFETs $M_1$, $M_2$, and $M_0$, which are connected between the substrate 1 and the first, the second, or the third supply terminal ($V_{DD1}$, $V_{DD2}$, or GND), respectively. The MOSFETs $M_1$, $M_2$, and $M_0$ are switched on and off analogous to the example of FIG. 6 in order to supply the lowest of the supply potentials to the substrate 1. In essence the circuit of FIG. 8 gives an example of the driver circuitry (cf. FIG. 6: comparators $K_0$, $K_1$, $K_2$, and minimum selectors $S_0$, $S_1$, $S_2$) for the MOSFETs $M_1$, $M_2$, and $M_0$. The comparators $K_1$ and $K_2$ for driving the MOSFETs $M_1$ and $M_2$ are also present in the example of FIG. 8. The comparators and further circuitry 30 are supplied by an internal supply potential $V_{DDint}$ which is approximately equal to the highest of the supply potentials ($V_{DD1}$, $V_{DD2}$, and GND), i.e., $V_{DDint} = \max\{V_{DD1}, V_{DD2}, GND\} - V_F$, where $V_F$ is the forward voltage of a diode ($\approx 0.6V$). Diodes $D_4$, $D_5$, and $D_6$ are connected between the circuit node providing the internal supply potential $V_{DDint}$ and the first, the second, and the third supply terminals ($V_{DD1}$, $V_{DD2}$, GND) respectively, such that the potential $V_{DDint}$ is thus equal to the highest supply potential.

The MOSFETs $M_1$ and $M_2$ are driven by the respective comparators $K_1$ and $K_2$. The inverting inputs of the comparators $K_1$ and $K_2$ receive the first and the second supply potentials $V_{DD1}$ and $V_{DD2}$ respectively, the non-inverting inputs of the comparators $K_1$ and $K_2$ are connected to the substrate 1. The MOSFET $M_0$ is driven via a resistor $R_{bias}$ connecting the gate of MOSFET $M_0$ and the internal supply potential $V_{DDint}$, such that the gate of MOSFET $M_0$ is charged via resistor $R_{bias}$ (and thus MOSFET $M_0$ is switched on) during normal operation. During normal operation the potential of the substrate 1 is equal to the third supply potential (GND), and MOSFETS $M_1$ and $M_2$ are in an off state.

If one of the comparators $K_1$ and $K_2$ switches on the respective MOSFET $M_1$ or $M_2$ due to a reversely connected power supply ($V_{DD1} < GND$ or $V_{DD2} < GND$), then MOSFET $M_0$ has to be switched off in order to avoid cross conduction via MOSFETs $M_1$ and $M_0$ or MOSFETs $M_2$ and $M_0$. For this purpose the gate-source voltage of the MOSFET $M_0$ is forced to approximately zero by means of transistors $M_3$ and $M_4$, whose control electrodes (gates) are connected to the outputs of comparators $K_1$ and $K_2$, respectively. That is, if comparator $K_1$ switches on MOSFET $M_1$, then transistor $M_3$ is also switched on thus short-circuiting the gate-source voltage of MOSFET $M_0$. If comparator $K_2$ switches on MOSFET $M_2$, then MOSFET $M_0$ is switched off by means of transistor $M_4$.

The gates of the MOSFETs $M_0$, $M_1$, and $M_2$ are protected by zener diodes $D_0$, $D_1$, $D_2$, which limit the gate-source voltages of the MOSFETs $M_0$, $M_1$, and $M_2$ to the zener voltage of the zener diodes $D_0$, $D_1$, $D_2$.

Throughout the above examples MOSFETs are used as semiconductor switches. Of course the MOSFETs can be replaced by any other type of field effect transistors or bipolar transistors dependent on the manufacturing process.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. An integrated circuit arrangement with a reverse voltage protection, the circuit arrangement comprising:
    a semiconductor body having a substrate and at least one substrate terminal;
    at least one semiconductor component integrated in the semiconductor body and being connected between a first supply terminal providing a first supply potential and a second supply terminal providing a second supply potential, the first supply potential being higher than the second supply potential during normal operation of the semiconductor component, and the first supply potential being lower than the second supply potential during reverse voltage operation of the semiconductor component; and
    a switch adapted to couple a substrate terminal to the first supply terminal during reverse voltage operation and to the second supply terminal during normal operation.

2. The integrated circuit arrangement of claim 1, wherein the switch is adapted for coupling different substrate terminals to the first supply terminal during reverse voltage operation.

3. The integrated circuit arrangement of claim 1, wherein the switch comprises a first semiconductor switch and a second semiconductor switch, wherein the first semiconductor switch is coupled between a first substrate terminal and the first supply terminal, and wherein the second semiconductor switch is coupled between the first substrate terminal and the second supply terminal.

4. The integrated circuit arrangement of claim 3, wherein the switch further comprises a first comparator and a second comparator controlling switching states of the first semiconductor switch and the second semiconductor switch such that the first semiconductor switch is in an on-state and the second semiconductor switch is in an off-state during reverse voltage operation, and vice versa during normal operation of the semiconductor component.

5. The integrated circuit arrangement of claim 3, wherein the first semiconductor switch and the second semiconductor switch each comprises a MOS-transistor having a drain-terminal, a source-terminal, and a gate-terminal, wherein
    the drain-terminal of the first semiconductor switch is coupled to the first supply terminal,
    the drain-terminal of the second semiconductor switch is coupled to the second supply terminal,
    the gate-terminal of the first semiconductor switch is coupled to the second supply terminal via a first gate resistor,
    the gate-terminal of the second semiconductor switch is coupled to the first supply terminal via a second gate resistor, and
    the source-terminals of the first semiconductor switch and the second semiconductor switch both are coupled to the first substrate terminal.

6. The integrated circuit arrangement of claim 5, wherein the switch further comprises at least two further semiconductor switches each having a drain-terminal, a source-terminal, and a gate-terminal, wherein
    the drain-terminals of the further semiconductor switches are coupled to the drain-terminal of the first semiconductor switch,
    the gate-terminals of the further semiconductor switches are coupled to the gate-terminal of the first semiconductor switch, and
    the source-terminals of the further semiconductor switches each are coupled to different substrate-terminals.

7. The integrated circuit arrangement of claim 6, wherein the different substrate-terminals are coupled via parallel resistors.

8. An integrated circuit arrangement with a reverse voltage protection, the circuit arrangement comprising:
    a semiconductor body having a substrate and at least one substrate terminal;
    at least one semiconductor component integrated in the semiconductor body and being connected between a first supply terminal providing a first supply potential and a second supply terminal providing a second supply potential, the first supply potential being higher than the second supply potential during normal operation of the semiconductor component, and the first supply potential being lower than the second supply potential during reverse voltage operation of the semiconductor component; and
    a switching circuit for coupling the at least one substrate terminal to the first supply terminal during reverse voltage operation and to the second supply terminal during normal operation.

9. The integrated circuit arrangement of claim 8, wherein the switching circuit comprises circuits for coupling different substrate terminals to the first supply terminal during reverse voltage operation, thus providing a uniform substrate potential in case of reverse voltage operation.

10. The integrated circuit arrangement of claim 8, wherein the switching circuit comprises a first semiconductor switch and a second semiconductor switch, wherein the first semiconductor switch is coupled between the first substrate terminal and the first supply terminal, and wherein the second semiconductor switch is coupled between the first substrate terminal and the second supply terminal.

11. The integrated circuit arrangement of claim 10, wherein the switching circuit further comprises a first comparator and a second comparator controlling switching states of the first semiconductor switch and the second semiconductor switch such that the first semiconductor switch is in an on-state and the second semiconductor switch is in an off-state during reverse voltage operation, and vice versa during normal operation of the semiconductor component.

12. The integrated circuit arrangement of claim 10, wherein the first semiconductor switch and the second semiconductor switch each comprise MOS-transistors having a drain-terminal, a source-terminal, and a gate-terminal, wherein
    the drain-terminal of the first semiconductor switch is coupled to the first supply terminal,
    the drain-terminal of the second semiconductor switch is coupled to the second supply terminal,
    the gate-terminal of the first semiconductor switch is coupled to the second supply terminal via a first gate resistor,
    the gate-terminal of the second semiconductor switch is coupled to the first supply terminal via a second gate resistor, and
    the source-terminals of the first semiconductor switch and the second semiconductor switch both are coupled to the first substrate terminal.

13. The integrated circuit arrangement of claim 12, wherein the switching circuit further comprises at least two further semiconductor switches each having a drain-terminal, a source-terminal, and a gate-terminal, wherein
- the drain-terminals of the further semiconductor switches are coupled to the drain-terminal of the first semiconductor switch,
- the gate-terminals of the further semiconductor switches are coupled to the gate-terminal of the first semiconductor switch, and
- the source-terminals of the further semiconductor switches each are coupled to different substrate-terminals.

14. An integrated circuit arrangement with a reverse voltage protection, the integrated circuit arrangement comprising:
- a semiconductor body having a substrate and at least one substrate terminal;
- at least a first semiconductor component integrated in the semiconductor body and being connected between a first supply terminal providing a first supply potential and a third supply terminal providing a third supply potential;
- at least a second semiconductor component integrated in the semiconductor body and being connected between a second supply terminal providing a second supply potential and the third supply terminal, where the first supply potential and the second supply potential are higher than the third supply potential during normal operation of the integrated circuit arrangement, and at least one of the first supply potential and/or the second supply potential is lower than the third supply potential during reverse voltage operation of the integrated circuit arrangement; and
- a switch configured to connect the at least one substrate terminal to the third supply terminal during normal operation and to connect the at least one substrate terminal either to the first supply terminal or the second supply terminal, whichever has a lower potential.

15. The integrated circuit arrangement of claim 14, wherein the at least one substrate terminal comprises a plurality of substrate terminals, and wherein the switch is adapted to connect different substrate terminals to the first supply terminal or, respectively, to the second supply terminal during reverse voltage operation.

16. The integrated circuit arrangement of claim 14, where the switch comprises at least three transistors, a first transistor being connected between the substrate terminal and the first supply terminal, a second transistor being connected between the substrate terminal and the second supply terminal, and a third transistor being connected between the substrate terminal and the third supply terminal.

* * * * *